United States Patent
Chen et al.

(10) Patent No.: US 9,236,391 B2
(45) Date of Patent: Jan. 12, 2016

(54) METHOD OF FORMING SPLIT-GATE CELL FOR NON-VOLATIVE MEMORY DEVICES

(71) Applicant: GLOBALFOUNDRIES Singapore Pte. Ltd., Singapore (SG)

(72) Inventors: Yu Chen, Singapore (SG); Huajun Liu, Singapore (SG); Siow Lee Chwa, Singapore (SG); Soh Yun Siah, Singapore (SG); Yanxia Shao, Singapore (SG); Yoke Leng Lim, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/732,867

(22) Filed: Jun. 8, 2015

(65) Prior Publication Data

US 2015/0270274 A1    Sep. 24, 2015

Related U.S. Application Data

(62) Division of application No. 13/788,174, filed on Mar. 7, 2013, now Pat. No. 9,111,866.

(51) Int. Cl.
*H01L 29/00* (2006.01)
*H01L 27/115* (2006.01)
*H01L 21/28* (2006.01)
*H01L 29/423* (2006.01)
*H01L 29/66* (2006.01)
(Continued)

(52) U.S. Cl.
CPC ...... *H01L 27/11521* (2013.01); *H01L 21/0332* (2013.01); *H01L 21/28273* (2013.01); *H01L 21/3213* (2013.01); *H01L 27/11568* (2013.01); *H01L 29/42328* (2013.01); *H01L 29/42344* (2013.01); *H01L 29/665* (2013.01); *H01L 29/6653* (2013.01); *H01L 29/6656* (2013.01); *H01L 29/66825* (2013.01)

(58) Field of Classification Search
CPC ............... H01L 21/28273; H01L 27/11521; H01L 29/42328
USPC .......... 257/316, 325, 314, 324; 438/261, 201, 438/301, 593, 258, 591
See application file for complete search history.

(56) References Cited

U.S. PATENT DOCUMENTS 8,853,027 B2 * 10/2014 Hong ................ H01L 29/42328
                                                257/321
8,901,632 B1 * 12/2014 Perera ................ H01L 29/7831
                                                257/314
(Continued)

OTHER PUBLICATIONS

D. Shum et al., "Highly Reliable Flash Memory with Self-aligned Split-gate Cell Embedded into High Performance 65 nm CMOS for Automotive & Smartcard Applications" IEEE International Memory Workshop, May 20-23, 2012, 4 pages.

*Primary Examiner* — Mohammed Shamsuzzaman
(74) *Attorney, Agent, or Firm* — Ditthavong & Steiner, P.C.

(57) ABSTRACT

Fabrication of a slim split gate cell and the resulting device are disclosed. Embodiments include forming a first gate on a substrate, the first gate having an upper surface and a hard-mask covering the upper surface, forming an interpoly isolation layer on side surfaces of the first gate and the hard-mask, forming a second gate on one side of the first gate, with an uppermost point of the second gate below the upper surface of the first gate, removing the hard-mask, forming spacers on exposed vertical surfaces, and forming a salicide on exposed surfaces of the first and second gates.

5 Claims, 5 Drawing Sheets

(51) Int. Cl.
*H01L 21/033* (2006.01)
*H01L 21/3213* (2006.01)

(56) References Cited

U.S. PATENT DOCUMENTS

| | | | |
|---|---|---|---|
| 2002/0137296 A1* | 9/2002 | Satoh | H01L 27/105 438/301 |
| 2007/0077705 A1* | 4/2007 | Prinz | B82Y 10/00 438/257 |
| 2007/0218633 A1* | 9/2007 | Prinz | B82Y 10/00 438/267 |
| 2008/0076221 A1* | 3/2008 | Kang | B82Y 10/00 438/267 |
| 2009/0111229 A1* | 4/2009 | Steimle | B82Y 10/00 438/261 |
| 2010/0059810 A1* | 3/2010 | Homma | H01L 27/11 257/324 |
| 2010/0099246 A1* | 4/2010 | herrick | B82Y 10/00 438/591 |
| 2014/0091380 A1* | 4/2014 | Hong | H01L 29/42328 257/314 |

* cited by examiner

METHOD OF FORMING SPLIT-GATE CELL FOR NON-VOLATIVE MEMORY DEVICES

CROSS-REFERENCE TO RELATED APPLICATION

This application is a Divisional of U.S. application Ser. No. 13/788,174, filed Mar. 7, 2013, the content of which is incorporated herein by reference in its entirety.

TECHNICAL FIELD

The present disclosure relates to split-gate non-volatile memory (NVM) cells. The present disclosure is particularly applicable to 40 nanometer (nm) and 90 nm thin-film storage (TFS) NVM memory, such as nitride storage and nanocrystal storage memory as well as floating gate (FG) memory.

BACKGROUND

Split-gate flash technology has been widely employed in medium-low density applications. Conventional split-gate flash memory density is difficult to scale without introducing cell reliability and performance issues. Efforts have been made to enhance cell reliability and performance. For example, bit cell 100a in FIG. 1A (depicting a pair of identical memory bit cells formed on an upper surface of substrate 101 and sharing a common source (S)), including charge-storage layer 103a, salicide (self-aligned silicide) 105a, and sidewall spacers 107a, utilizes an overlap between control gate (CG) 109a and select gate (SG) 111a to avoid the easy CG-SG breakdown induced by the salicide process. Bit cell 100b in FIG. 1B, including CG 109b, SG 111b, charge-storage layer 103b, and salicide 105b, has a relatively simpler fabrication process because there is no CG-SG overlap. However, SG-CG breakdown voltage and cell reliability are poor.

These approaches are problematic for scaling to high-density applications in several respects. For example, a complex and costly three-mask lithography process must be utilized to form the overlapping gate structure of bit cell 100a. Alignment of the three masks is critical; any misalignment of the polysilicon layers used to form the gates results in CG 109a overlapping SG 111a by too much or too little. Too much overlap will minimize the salicide 105a formed over SG 111a. If the overlap is insufficient, poor isolation between CG 109a and SG 111a results, thereby decreasing the breakdown voltage between the gates. Employing the non-overlapping gate structure of bit cell 100b simplifies the fabrication process, but is costly because an additional chemical-mechanical polishing (CMP) step must be utilized to planarize the polysilicon of CG 109b and SG 111b.

Bit cell 100c in FIG. 1C illustrates a conventional floating gate (FG) split-gate NVM design. FG 113 and CG 109c, separated by interpoly dielectric (IPD) 115, form a dual polysilicon gate stack on tunnel oxide 117 that is separated from SG 111c by interpoly oxide (IPO) 119. SG 111c is formed through a polysilicon spacer etch process. No silicide is formed in the NVM region, causing high contact resistance on the source and rain area and, therefore, degraded electrical performance. In addition, processing of the device is costly because the 2-polysilicon height of the dual gate stack creates a difference in topology between the NVM and logic circuit sections. Thus, an additional mask must be used to protect the NVM array during etching of the logic sections.

A need therefore exists for methodology enabling fabrication of a split-gate NVM device exhibiting enhanced cell reliability and electrical performance in high-density applications, and for the resulting device.

SUMMARY

An aspect of the present disclosure is a method for fabricating a split-gate NVM device exhibiting enhanced cell reliability and electrical performance.

Another aspect of the present disclosure is a split-gate NVM device exhibiting enhanced cell reliability and electrical performance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first gate on a substrate, the first gate having an upper surface and a hard-mask covering the upper surface; forming an interpoly isolation layer on side surfaces of the first gate, the hard-mask and substrate; forming a second gate on one side of the first gate, with an uppermost point of the second gate below the upper surface of the first gate; removing the hard-mask; and forming spacers on exposed vertical surfaces; forming a salicide on exposed surfaces of the first and second gates and source/drain area.

Aspects of the present disclosure include forming the hard-mask of a nitride. Further aspects include the first gate being a stack of a floating gate, a dielectric layer, and a control gate, and the second gate being a select gate. Other aspects include forming the interpoly isolation layer of an oxide. Additional aspects include forming the second gate by depositing a blanket layer of polysilicon on the substrate and on both sides of the first gate; etching the polysilicon to form a polysilicon spacer on each side of the first gate; and removing the polysilicon spacer from one side of the first gate.

Another aspect of the present disclosure includes forming the interpoly isolation layer of a nitride memory storage layer or a nanocrystal layer. Other aspects include forming the interpoly isolation layer on the substrate concurrently with forming the interpoly isolation layer on side surfaces of the first gate. Further aspects include forming the second gate by: depositing a blanket polysilicon layer; etching the polysilicon to form a polysilicon spacer on each side of the first gate; and removing the polysilicon spacer from one side of the first gate. Other aspects include the first gate being a select gate and the second gate being a control gate. Additional aspects include the first gate being a control gate and the second gate being a select gate. Further aspects include forming an interpoly dielectric layer between the first and second gates.

Another aspect of the present disclosure is a device including: a first gate on a substrate, the first gate having an upper surface; an interpoly isolation layer on side surfaces of the first gate and substrate; a second gate adjacent the interpoly isolation layer on one side of the first gate, the second gate having a spacer shape and having an uppermost point of the second gate below the upper surface of the first gate; spacers formed on exposed vertical surfaces of the first and second gates and the interpoly isolation layer; and a salicide formed on exposed non-vertical surfaces of the first and second gates and the substrate.

Other aspects include the first gate being a stack of a floating gate, a dielectric layer, and a control gate, and the second gate being a select gate. Further aspects include the interpoly isolation layer being an oxide. Another aspect includes the interpoly isolation layer being a nitride memory storage layer or a nanocrystal layer. Additional aspects include the interpoly isolation layer being between the second gate and the substrate. Other aspects include the first gate being a select gate and the second gate being a control gate. Another aspect includes the first gate being a control gate and the second gate being a select gate. Further aspects include an interpoly dielectric layer between the first and second gates.

Another aspect of the present disclosure includes: forming a first gate on a substrate, the first gate having an upper surface and a nitride hard-mask covering the upper surface; forming an interpoly oxide layer, nitride memory storage layer or nanocrystal layer on side surfaces of the first gate and the nitride hard-mask; depositing a blanket layer of polysilicon; etching the polysilicon to form a polysilicon spacer with an uppermost point of the polysilicon spacer below the upper surface of the first gate on each side of the first gate; removing the polysilicon spacer from one side of the first gate, the remaining polysilicon spacer forming a second gate; removing the nitride hard-mask; forming spacers on all exposed vertical surfaces; and forming a salicide on exposed surfaces of the first and second gates, wherein the first gate is one of a select gate and a control gate, and the second gate is the other of a select gate and a control gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of poor scalability, process complexity, and unreliable breakdown voltage attendant upon formation of conventional split-gate NVM cell devices. In accordance with exemplary embodiments of the present disclosure, a simplified process methodology is utilized to form a split-gate NVM cell with enhanced CG-SG isolation. The resulting device maintains a small cell size and provides improved performance.

Methodology in accordance with embodiments of the present disclosure includes utilization of a hard mask to protect one of an SG and a CG while etching the other of the SG and the CG as a polysilicon spacer. Additional aspects include incorporating a salicide process to form contact regions on the split-gate polysilicon structures.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2F schematically illustrate various process steps for fabricating a TFS split-gate cell, in accordance with an exemplary embodiment of the present disclosure.

Figure 1A:
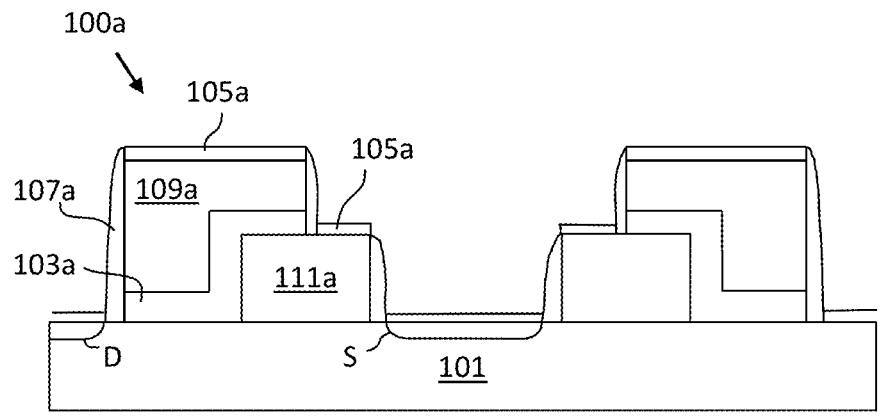
FIGS. 1A through 1C schematically illustrate background art split-gate NVM cell designs.
Figure 1B:
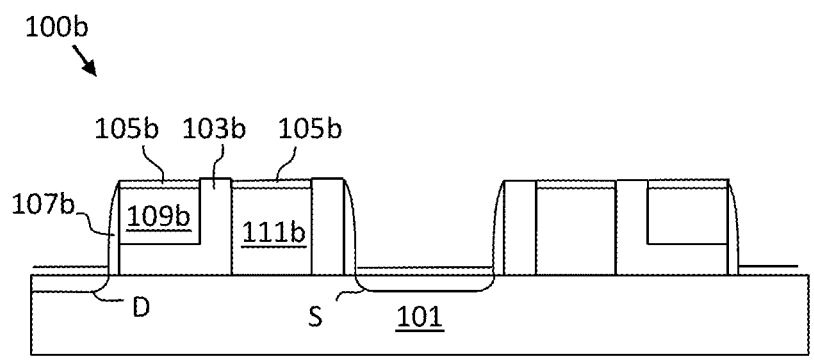
Figure 1C:
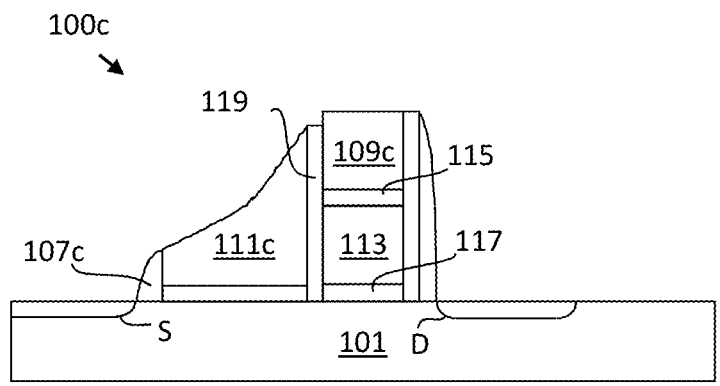
Figure 2A:
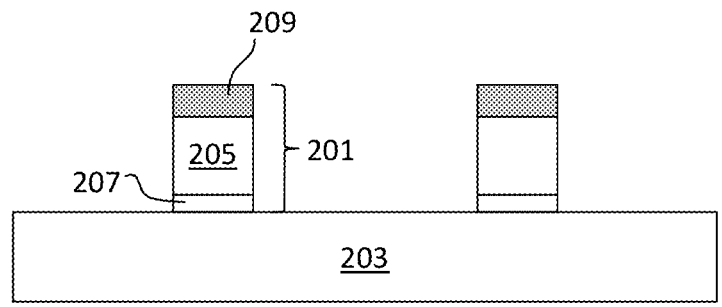
FIGS. 2A through 2F schematically illustrate a process flow for fabricating a TFS split-gate cell, in accordance with an exemplary embodiment of the present disclosure.

FIG. 2A illustrates a polysilicon gate-stack structure 201 formed on an upper surface of substrate 203, after conventional front-end-of-line (FEOL) integrated circuit (IC) fabrication processes. Polysilicon gate-stack 201 is formed by depositing SG 205 on SG oxide layer 207 and forming hard-mask 209 atop SG 205. Hard-mask 209 may be formed, for example, of nitride.

Figure 2B:
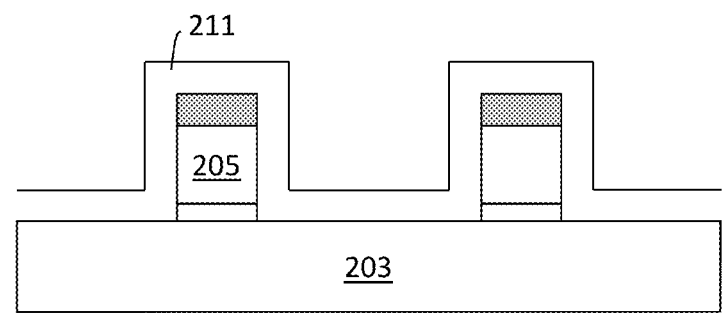

As illustrated in FIG. 2B, charge-storage layer 211 is next formed on the polysilicon gate stack structures and substrate 203 by a conformal deposition process. Charge-storage layer 211 may be formed of any material suitable for charge trapping, for example nanocrystals or silicon nitride.

Figure 2C:
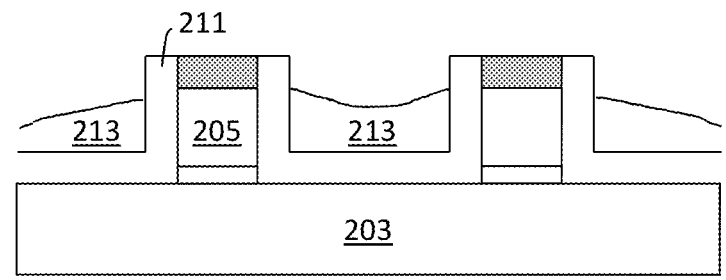

Adverting to FIG. 2C, a second thick polysilicon layer (not shown) is deposited over charge-storage layer 211 and etched to form CG polysilicon spacers 213 between the polysilicon gate stacks. The etching may be performed, for example by a dry etching process. CG polysilicon spacers 213 have a height equal to or less than the height of SG 205. The specific height may be chosen to adjust the transistor channel length of SG 205. The polysilicon layer and portions of charge-storage layer 211 over the hard-mask 209 are also removed, for example by wet etching process. Because the resulting structures share the same height as gate structures in the logic circuit, there is no difference in the topography between the NVM array and logic circuit (not shown for illustrative convenience).

Figure 2D:
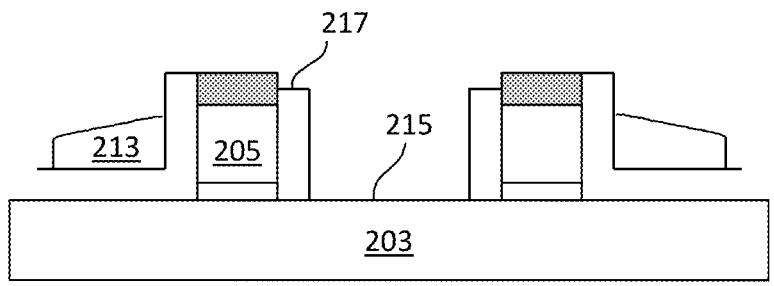

Adverting to FIG. 2D, polysilicon spacer 213 between the polysilicon gate stacks and the portions of charge-storage layer 211 on substrate 203 between the gate stacks are removed, such as by etching. As shown, an upper surface of substrate 203 is exposed in region 215. The etching may be performed, for example by a dry and/or wet etching process. As further shown, the vertical portions 217 of charge-storage layer 211 adjacent to region 215 may be partially etched due to inherent limitations on the selectivity and accuracy of the etching process.

Figure 2E:
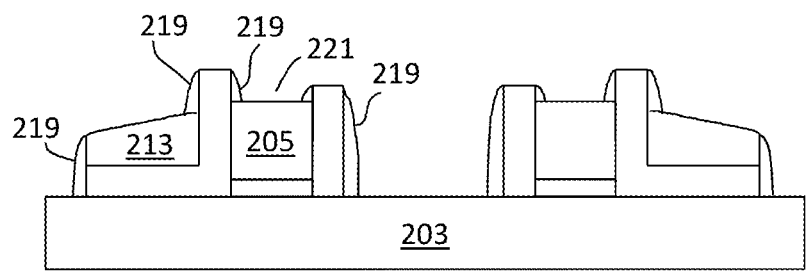

Adverting to FIG. 2E, after etching the logic gate (not shown for illustrative convenience), hard-mask 209 is removed to form cavity 221, and sidewall spacers 219 are formed on all exposed vertical surfaces. The removal step is integrated into the process flow such that it occurs after the logic polysilicon gate etch step so that no additional array block mask is required during the logic poly gate etch, as the hard-mask 209 protects SG 205 during the logic poly etch. Sidewall spacers 219 may be formed of oxide or nitride. An insulating layer (not shown for illustrative convenience) of a dielectric material may be formed between the polysilicon gates to further improve CG-SG isolation.

Figure 2F:
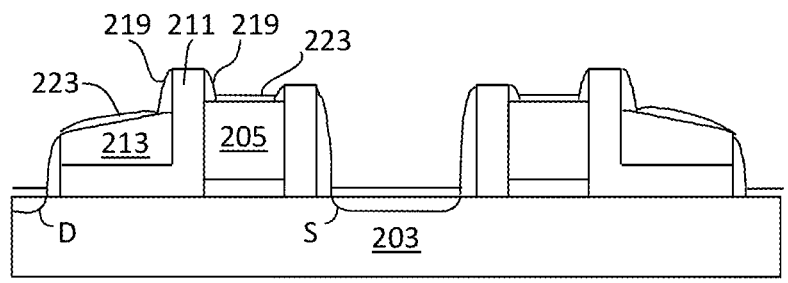

Adverting to FIG. 2F, a salicide process is used to form salicide 223 on the exposed upper portions of CG 213 and SG 205 self-aligned to sidewall spacers 219. Salicide is also formed on the source/drain area, resulting in lower contact resistance and, thus, better electrical performance. Subsequently, conventional back-end-of-line (BEOL) steps may commence for completion of the IC fabrication process.

The use of sidewall spacers 219 between the polysilicon materials of SG 205 and CG 213 enhances the breakdown voltage and prevents charge leakage. In addition, sidewall spacers 219 provide alignment for the salicide process. Because the split-gate cell does not require CG 213 to overlap SG 205, the process is simpler and less costly. In addition, a separate NVM array block mask is not required during logic gate etching. Although this embodiment has been described as an SG first process, alternatively the CG may be formed first.

Figure 3A:
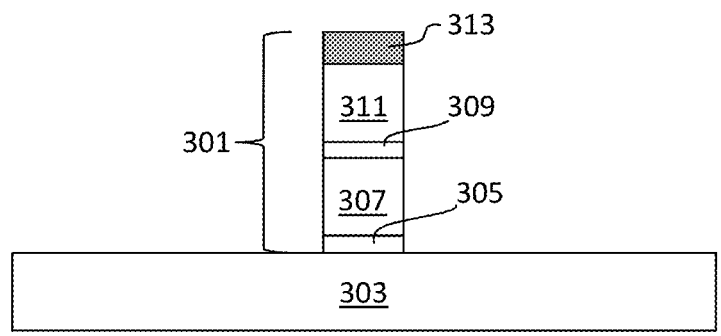
FIGS. 3A through 3F schematically illustrate a process flow for fabricating a FG split-gate cell, in accordance with an exemplary embodiment of the present disclosure.

FIGS. 3A through 3F schematically illustrate various process steps for fabricating a FG split-gate NVM cell, in accordance with an exemplary embodiment of the present disclosure. FIG. 3A illustrates a dual polysilicon gate-stack structure 301 formed on an upper surface of substrate 303, after conventional FEOL IC fabrication processes. Dual polysilicon gate-stack 301 is formed by depositing a first polysilicon layer on a tunnel oxide layer 305 and etching to form FG 307 over tunnel oxide 305. Next, an IPD layer, a CG polysilicon layer, and a thick nitride layer are consecutively deposited and patterned to form IPD 309, CG 311, and hard-mask 313, respectively. The tunnel oxide 305 material may be silicon dioxide, an oxide/nitride/oxide (ONO), or any other tunnel dielectric. The IPD 309 may be any high-k dielectric, for example hafnium oxide ($HfO_2$), in-situ steam generation (ISSG), or ONO. Hard-mask 313 may be a nitride.

Figure 3B:
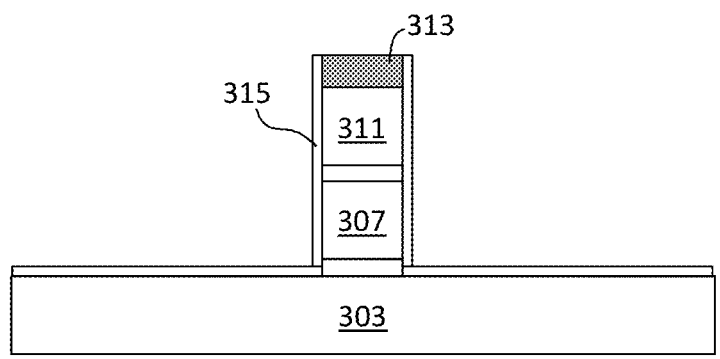

Adverting to FIG. 3B, an IPO layer 315 is formed on the sidewalls of dual polysilicon gate-stack 301. To form IPO layer 315, a thin oxide layer is deposited on dual polysilicon gate-stack 301 by a conformal deposition process and then anistropically etched with hard-mask 313 serving as an etch stop. IPO layer 315 improves CG-SG isolation between dual polysilicon gate-stack 301 and the adjacent SG poly that is formed in a later step.

Figure 3C:
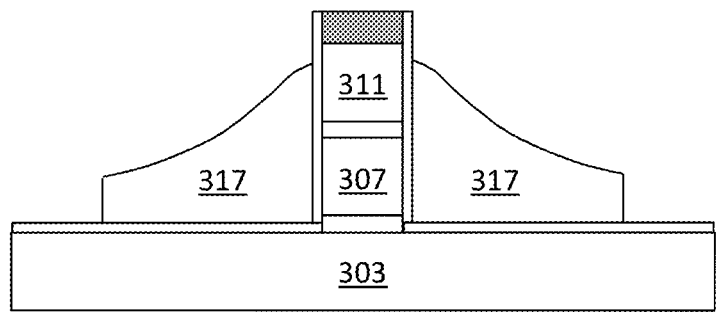

Adverting to FIG. 3C, a third polysilicon layer (not shown) is deposited and etched to form polysilicon spacers 317. The deposited polysilicon covers the dual polysilicon gate stack. Following the etching, the height of polysilicon spacers 317 is equal to or less than the height of dual polysilicon gate-stack 301. A conventional spacer anisotropic etch self-aligned to hard-mask 313 may be used, thus protecting CG 311 during the etching.

Figure 3D:
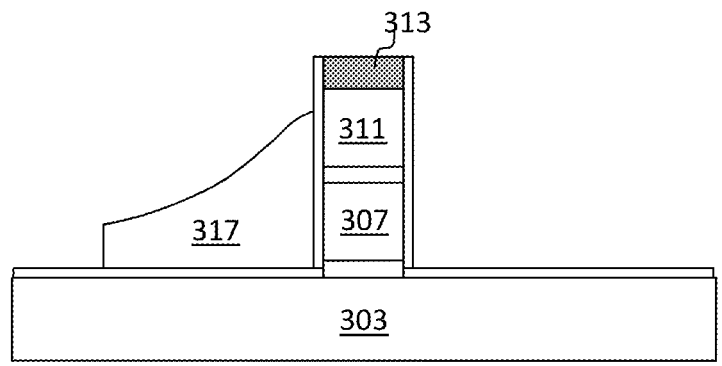

Adverting to FIG. 3D, a mask (not shown) is applied and polysilicon spacer 317 is removed from the drain region (not shown) to the right of dual polysilicon gate-stack 301. Hard-mask 313 protects CG 311 during the etching.

Figure 3E:
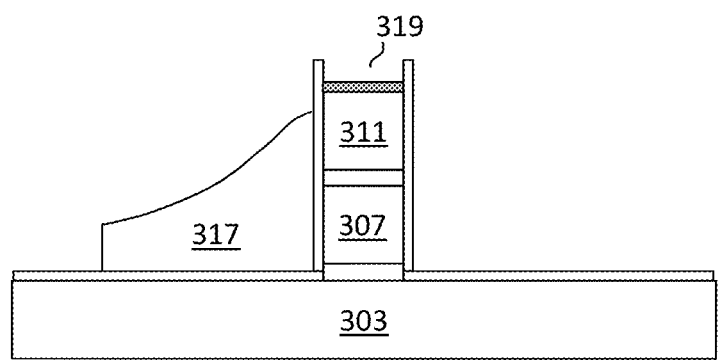

Adverting to FIG. 3E, hard-mask 313 is removed to form cavity 319. The removal of hard-mask 313 is integrated into the process flow such that it is performed subsequent to etching the poly gates of the logic circuit (not shown for illustrative convenience). Accordingly, no additional array block mask is required because hard-mask 313 protects CG 311 during the logic poly etch. A wet etch of hot phosphoric acid may be used for etching of the hard-mask nitride because the acid is highly selective to oxide, thus leaving IPO layer 315 behind.

Figure 3F:
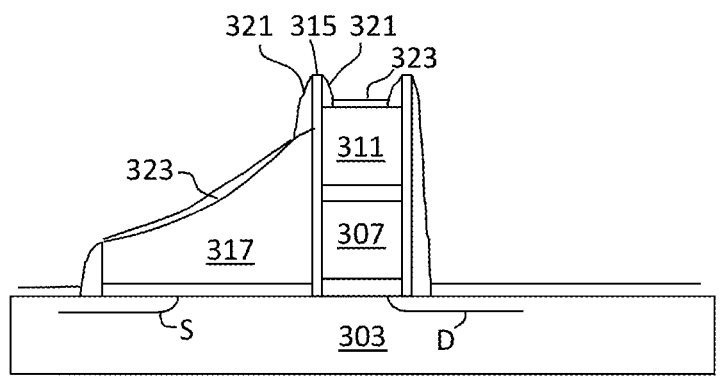

Adverting to FIG. 3F, the nitride of hard-mask 313 is completely removed from cavity 319. Sidewall spacers 321 are formed on exposed vertical surfaces. Sidewall spacers 321 provide alignment for a salicide process to form salicide contact regions 323 on the exposed upper surfaces of CG 311 and SG 317. As mentioned, the use of hard-mask 313 protects CG 311 during the logic gate etch. As a result, an additional masking step is not required to protect the NVM cell array thus making the fabrication process simpler and less costly.

The embodiments of the present disclosure can achieve several technical effects, including better CG-SG isolation, improved electrical performance through use of a salicide process, with a simplified integration process flow, and overall reduction in cost. The present disclosure enjoys industrial applicability in any of various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising: a first gate on a substrate, the first gate having an upper surface; an interpoly isolation layer or charge storage layer on side surfaces of the first gate and
   extending above the upper surface of the first gate;
   a second gate adjacent to the interpoly isolation layer or charge storage layer on a first side of the first gate, the second gate having a spacer shape and having an uppermost point of the second gate below the upper surface of the first gate;
   spacers formed on exposed vertical surfaces of the first and second gates and the interpoly isolation layer;
   a salicide formed on exposed non-vertical surfaces of the first and second gates and the substrate; and
   wherein the first gate is one of a select gate and a control gate, and the second gate is the other of a select gate and a control gate, wherein an uppermost point of the interpoly isolation layer or charge storage layer on the first side is higher than an uppermost point of the second side opposite to the first side and an uppermost point of the first gate is lower than the uppermost point of the interpoly isolation layer or charge storage layer on the second side.

2. The device according to claim 1, wherein the interpoly isolation layer comprises an oxide.

3. The device according to claim 1, wherein the interpoly isolation layer comprises a nitride memory storage layer or a nanocrystal layer.

4. The device according to claim 3, further comprising the interpoly isolation layer between the second gate and the substrate.

5. The device according to claim 3, further comprising the interpoly dielectric layer between the first and second gates.

* * * * *